(12) United States Patent
Ma et al.

(10) Patent No.: US 8,174,019 B2
(45) Date of Patent: May 8, 2012

(54) STATIC-TOLERANT DISPLAY APPARATUS

(75) Inventors: Han-Na Ma, Seoul (KR); Ji-Yong Park, Yongin-si (KR); Jin-Suk Park, Seoul (KR); Gyung-Soon Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 172 days.

(21) Appl. No.: 12/392,059

(22) Filed: Feb. 24, 2009

(65) Prior Publication Data
US 2009/0250702 A1    Oct. 8, 2009

(30) Foreign Application Priority Data
Apr. 7, 2008   (KR) .............................. 2008-0032256

(51) Int. Cl.
*H01L 27/14* (2006.01)
(52) U.S. Cl. .............................. 257/72; 257/66; 438/149
(58) Field of Classification Search .................... 257/66, 257/72; 438/149
See application file for complete search history.

(56) References Cited

U.S. PATENT DOCUMENTS
2006/0102903 A1* 5/2006 Kim et al. ...................... 257/72
2008/0291347 A1* 11/2008 Kim et al. ...................... 349/33

FOREIGN PATENT DOCUMENTS
JP    2006-337430 A    12/2006
KR    1020050105577 A    11/2005
KR    1020060012373 A     2/2006

* cited by examiner

*Primary Examiner* — Jami M Valentine
(74) *Attorney, Agent, or Firm* — Innovation Counsel LLP (57) ABSTRACT

A display apparatus includes a thin film transistor having a top-gate structure and a storage capacitor that are arranged on a first substrate. An upper electrode of the storage capacitor has a size larger than a size of a lower electrode, so as to cover an entire surface of the lower electrode in a plan view. Thus, electric field caused by static electricity may be prevented from accumulating at a corner of the upper electrode when the electric filed flows from the lower electrode to the upper electrode, thereby preventing an intermediate insulating layer from being burnt.

12 Claims, 12 Drawing Sheets

STATIC-TOLERANT DISPLAY APPARATUS

CROSS-REFERENCE TO RELATED APPLICATION

This application claims priority to Korean Patent Application No. 2008-32256 filed on Apr. 7, 2008, the contents of which are herein incorporated by reference in their entirety.

BACKGROUND

1. Field of the Invention

The present invention relates to a display apparatus. More particularly, the present invention relates to a display apparatus capable of preventing a display defect thereof due to a static electricity.

2. Description of the Related Art

A display apparatus is a device that displays an image corresponding to an external input signal in a pixel area. In general, the display apparatus includes a first substrate and a second substrate coupled with the first substrate with the two substrates facing each other, with various processes used to manufacture the first and second substrates.

During the manufacturing process, static electricity can be generated in the first substrate or the second substrate. Especially when thin layers are formed on the substrates in order to form devices, these thin layers are burnt by the static electricity, thereby causing defects in the devices.

SUMMARY

An exemplary embodiment of the present invention provides a display apparatus capable of preventing malfunctions caused by a static electricity.

Another exemplary embodiment of the present invention also provides a thin film transistor array substrate capable of preventing malfunction caused by a static electricity.

In an exemplary embodiment of the present invention, a display apparatus includes a first substrate, a thin film transistor arranged on the first substrate and having a first semiconductor pattern that defines an active area and serves as a lower layer, a second semiconductor pattern connected to the first semiconductor pattern, a connector disposed between the first semiconductor pattern and the second semiconductor pattern, a storage electrode arranged on the second semiconductor pattern and covering an entire surface of the second semiconductor pattern in a plan view, and a pixel electrode electrically connected to the thin film transistor.

In another exemplary embodiment of the present invention, a display apparatus includes a first substrate, a thin film transistor arranged on the first substrate and having a semiconductor pattern that defines an active area and serves as a lower layer, a first storage electrode, a second storage electrode arranged on the first storage electrode and covering an entire surface of the first storage electrode in a plan view, and an insulating layer disposed between the first storage electrode and the second storage electrode.

In another exemplary embodiment of the present invention, a thin film transistor array substrate includes a substrate, a thin film transistor arranged on the substrate and having a first semiconductor pattern that defines an active area and serves as a lower layer, a second semiconductor pattern connected to the first semiconductor pattern, a connector disposed between the first semiconductor and the second semiconductor pattern, and a storage electrode arranged on the second semiconductor pattern and covering an entire surface of the second semiconductor pattern in a plan view.

BRIEF DESCRIPTION OF THE DRAWINGS

The above and other advantages of the present invention will become readily apparent by reference to the following detailed description when considered in conjunction with the accompanying drawings wherein.

DESCRIPTION OF THE EMBODIMENTS

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 1:
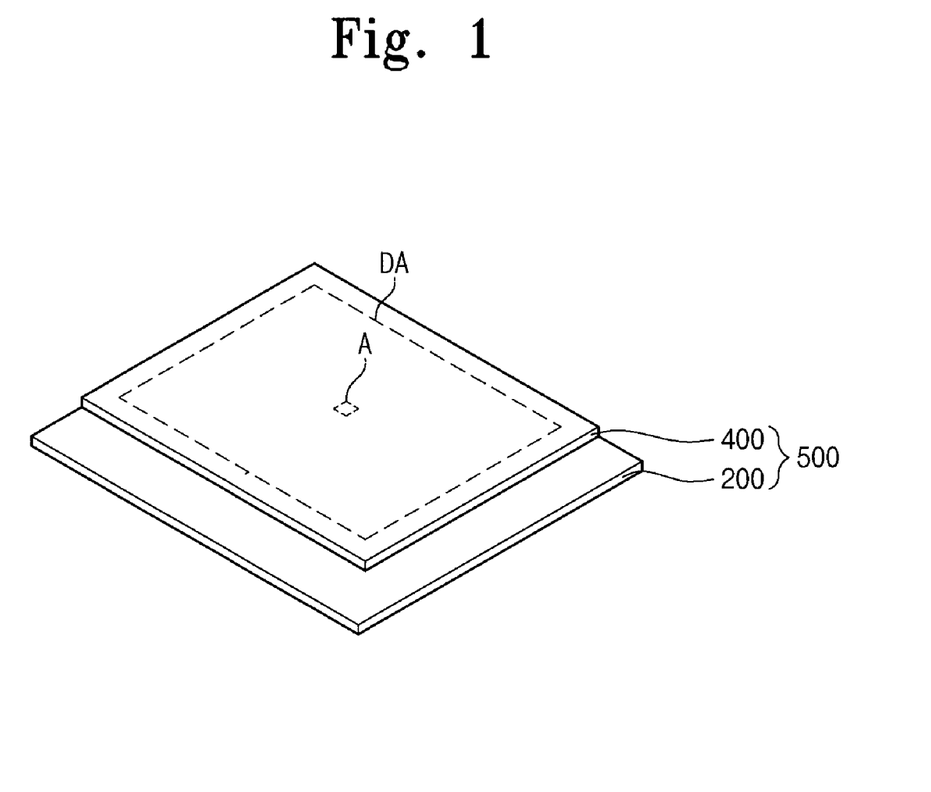
FIG. 1 is a perspective view showing an exemplary embodiment of a liquid crystal display according to the present invention.
Figure 2:
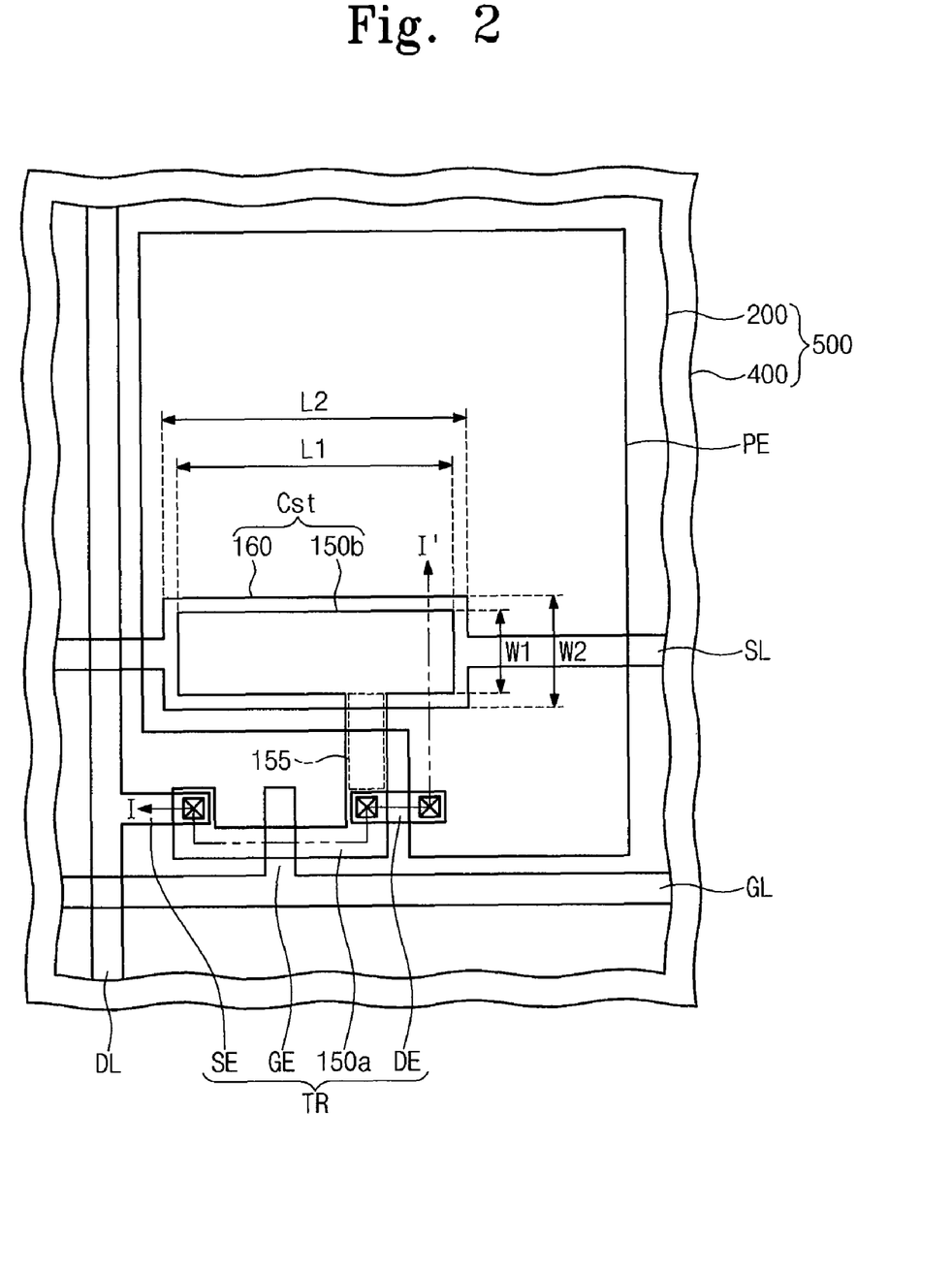
FIG. 2 is a partially enlarged view showing a portion "A" of FIG. 1.

FIG. 1 is a perspective view showing an exemplary embodiment of a liquid crystal display according to the present invention, and FIG. 2 is a partially enlarged view showing a portion A of FIG. 1.

Referring to FIGS. 1 and 2, a liquid crystal display (LCD) 500 includes an array substrate 200, a color filter substrate 400 facing the array substrate 200, and liquid crystal (not shown) interposed between the array substrate 200 and the color filter substrate 400. A display area DA is defined in the LCD 500, and the LCD 500 displays an image in the display area DA.

The array substrate 200 includes a gate line GL and a data line DL that crosses the gate line GL to define a pixel area, a pixel electrode PE that controls an alignment of the liquid crystal, and a thin film transistor TR that is electrically connected to the pixel electrode PE are arranged in the pixel area. In FIGS. 1 and 2, the pixel area is not illustrated in detail. However, since the LCD 500 controls a transmittance according to the alignment of the liquid crystal to display the image, and the pixel electrode PE controls the alignment of the liquid crystal, the pixel area may be considered simply as an area in which the pixel electrode PE is arranged.

Also, the array substrate 200 includes a storage line SL that is spaced apart from the gate line GL and a storage electrode 160 that branches from the storage line SL. The storage line SL and the storage electrode 160 may have the same material as the gate line GL, and the storage electrode 160 serves as an upper electrode of a storage capacitor Cst.

The thin film transistor TR includes a gate electrode GE, a source electrode SE, a drain electrode DE, and a first semiconductor pattern 150a. In this embodiment, the gate electrode GE branches from the gate line GL, the source electrode SE branches from the data line DL, and the gate electrode GE and the source electrode SE are electrically connected to the first semiconductor pattern 150a. Also, the drain electrode DE includes the same material as the source electrode SE. The drain electrode DE is spaced apart from the source electrode SE and electrically connected to the first semiconductor pattern 150a.

The first semiconductor pattern 150a includes polysilicon and serves as an active pattern that defines an active area of the thin film transistor TR. Also, the thin film transistor TR has a top-gate structure, and the first semiconductor pattern 150a is arranged under the gate electrode GE.

The storage capacitor Cst includes a second semiconductor pattern 150b as a lower electrode. The second semiconductor pattern 150b is electrically connected to the first semiconductor pattern 150a and overlaps with the storage electrode 160 to form the storage capacitor Cst. A connector 155 is disposed between the first semiconductor pattern 150a and the second semiconductor 150b. Accordingly, the first semiconductor pattern 150a and the second semiconductor pattern 150b are electrically connected to each other by the connector 155.

The second semiconductor pattern 150b has an island shape in a plan view together with the first semiconductor pattern 150a and the connector 155. Thus, the second semiconductor pattern 150b is arranged in the pixel area, and the second semiconductor pattern 150b is separated from adjacent second semiconductor pattern arranged in adjacent pixel area.

In the present exemplary embodiment, the second semiconductor pattern 150b is extended from the first semiconductor pattern 150a, and the connector 155 is disposed between the first semiconductor pattern 150a and the second semiconductor pattern 150b. However, the first semiconductor pattern 150a and the second semiconductor pattern 150b may be separated from each other, and the connector 155 may be electrically connected to the first semiconductor pattern 150a and the second semiconductor pattern 150b.

The storage electrode 160 has a size larger than a size of the second semiconductor pattern 150b when viewed in a plan view, so that it covers an entire surface of the second semiconductor pattern 150b. More particularly, the second semiconductor pattern 150b and the storage electrode 160 both have a rectangular shape. The second semiconductor pattern 150b has a first length L1 and a first width W1, and the storage electrode 160 has a second length L2 that is larger than the first length L1 and a second width W2 that is larger than the first width W1.

In the present exemplary embodiment, the storage electrode 160 and the second semiconductor pattern 150b that are included in the storage capacitor Cst both have a rectangular shape. However, the storage electrode 160 and the second semiconductor pattern 150b may have different shapes. In that case, the storage electrode 160 may still be larger than the size of the second semiconductor pattern 150b, so as to cover the entire surface of the second semiconductor pattern 150b as described above.

The pixel electrode PE is arranged in the pixel area defined by the gate line GL and the data line DL, and is electrically connected to the drain electrode DE. The pixel electrode PE includes a transparent material such as indium tin oxide (ITO) or indium zinc oxide (IZO) and forms an electric field together with a common electrode 310 (shown in FIG. 3), that is arranged on the color filter substrate 400, to control the alignment of the liquid crystal.

Figure 3:
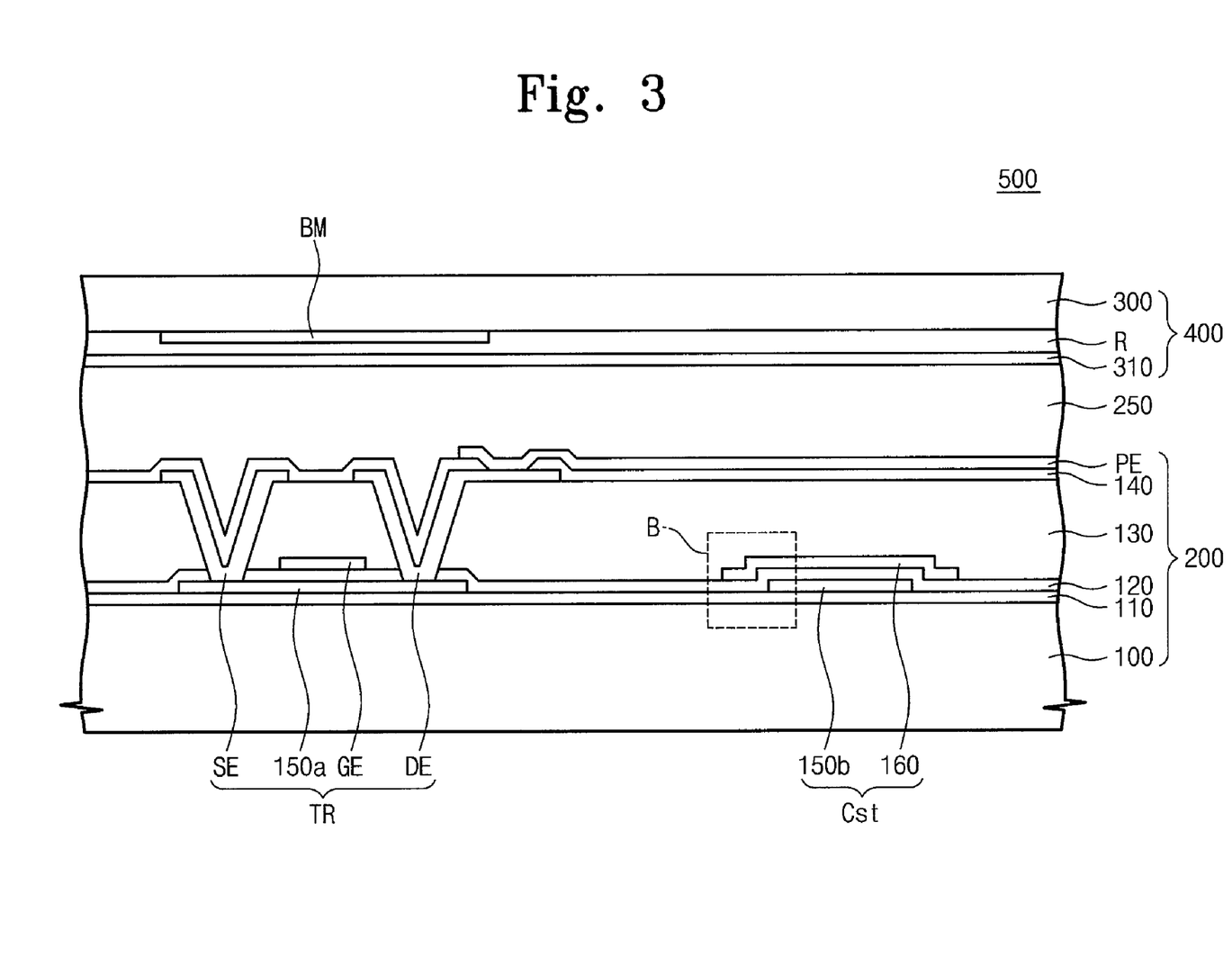
FIG. 3 is a cross-sectional view taken along a line I-I' of FIG. 1.

FIG. 3 is a cross-sectional view taken along a line I-I' of FIG. 1.

Referring to FIG. 3, the array substrate 200 includes a first base substrate 100. A barrier layer 110 that blocks ions from the first base substrate 100 is arranged on the first base substrate 100. The thin film transistor TR, the pixel electrode PE electrically connected to the thin film transistor TR, and the storage capacitor Cst are arranged on the barrier layer 110.

The thin film transistor TR has a top-gate structure. Therefore, the gate electrode GE is arranged on the first semiconductor pattern 150a, which serves as the active pattern of the thin film transistor TR. A gate insulating layer 120 is interposed between the gate electrode GE and the first semiconductor pattern 150a. Although not shown in detail in FIG. 3, the first semiconductor pattern 150a may be divided into a low-concentration doping area and a high-concentration doping area according to an amount of impurities doped thereinto.

The storage capacitor Cst includes storage electrode 160 as the upper electrode thereof, and second semiconductor pattern 150b as the lower electrode thereof. As described above, the storage electrode 160 branches from the storage line SL (shown in FIG. 2), and the second semiconductor pattern 150b extends from the first semiconductor pattern 150a.

When the array substrate 200 is manufactured, a static electricity accumulated in the first semiconductor pattern 150a and the second semiconductor pattern 150b may cause an electric field between the second semiconductor pattern 150b and the storage electrode 160. The storage electrode 160 covers an entire surface of the second semiconductor pattern 150b in a sectional view, with gate insulating layer 120 interposed therebetween, and a size of the storage electrode 160 is greater than a size of the second semiconductor pattern 150b. Thus, the electric field caused by the static electricity can be prevented from being accumulated at corners of the storage electrode 160, preventing unwanted discharge and keeping the gate insulating layer 120 from being "burnt." More detailed description of the above will be presented below, with reference to FIG. 4.

Meanwhile, an organic insulating layer 130 is arranged on the first base substrate 100, covering the thin film transistor TR and the storage capacitor Cst. The organic insulating layer 130 is provided with contact holes formed therethrough, so that the source electrode SE and the drain electrode DE may be electrically connected to the first semiconductor pattern 150a through the contact holes.

Also, an inter-insulating layer 140 is arranged on the first base substrate 100 to cover the source electrode SE and the drain electrode DE, and the pixel electrode PE is arranged on the inter-insulating layer 140. The inter-insulating layer 140 is provided with a contact hole formed therethrough, so that the drain electrode DE and the pixel electrode PE are electrically connected to each other.

The color filter substrate 400 faces the array substrate 200 while liquid crystal 250 is interposed therebetween. The color filter substrate 400 includes a second base substrate 300, and a black matrix BM, a red filter R, and the common electrode 310 are arranged on the second base substrate 300.

The black matrix BM includes a material that blocks a light and is arranged on the second base substrate 300, and over the thin film transistor TR. The red filter R filters a white light that is emitted through the array substrate 200, so that the white light may have a certain color. In FIG. 3, only the red filter R has been shown. However, a green filter (not shown) and blue filter (not shown) may be further arranged on the second base substrate 300.

The common electrode 310 is arranged on the red filter R. The common electrode 310 includes a transparent conductive layer to form an electric field together with the pixel electrode PE, thereby controlling the alignment of the liquid crystal 250.

Figure 4:
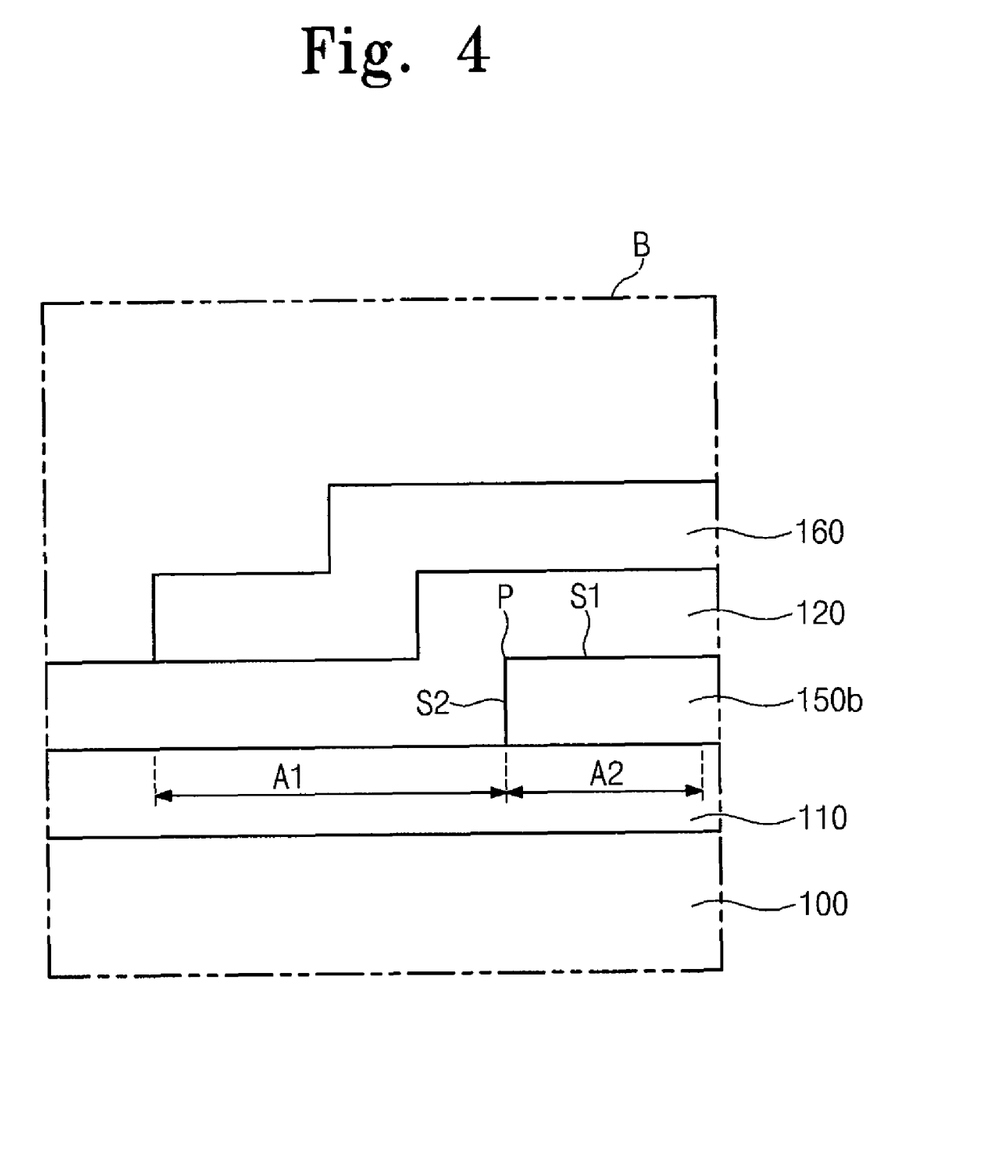
FIG. 4 is a partially enlarged view of a portion "B" of FIG. 3.

FIG. 4 is a partially enlarged view of portion "B" of FIG. 3.

Referring to FIGS. 3 and 4, the storage electrode 160 is arranged on the second semiconductor pattern 150b, with gate insulating layer 120 positioned therebetween. More particularly, the storage electrode 160 overlaps with the second semiconductor pattern 150b in a second area A2, but does not overlap with the second semiconductor pattern 150b in a first area A1.

It is observed that, for various reasons, static electricity may be generated during manufacture of the array substrate 200. Conventionally, this static electricity is caused by electrification caused by friction between a surface of the first base substrate 100 and some other surface during manufacture of the array substrate 200.

The static electricity may be accumulated in the first base substrate 100, and the static electricity may cause electric field between conductive layers arranged on the first base substrate 100. In case that insulating layers are interposed between the conductive layers, the electric filed may pass through the insulating layers. When the electric field passes through the insulating layers, the electric field may be concentrated at certain portions of the insulating layers, and the insulating layers may be burnt or otherwise compromised by the electric field.

However, in the present exemplary embodiment, the storage electrode 160 has a size larger than that of the second semiconductor pattern 150b in a plan view, thus covering the entire surface of the second semiconductor pattern 150b. Therefore, when the electric field caused by the static electricity generated in the first base substrate 100 flows to the storage electrode 160 through the second semiconductor pattern 150b, the electric field may be prevented from being concentrated at certain portions, e.g., corners, of the storage electrode 160.

More particularly, the electric field generated in an end portion of the second semiconductor pattern 150b dispersedly flows to the storage electrode 160 that is arranged in the first area A1 and the second area A2 through an upper surface S1, a side surface S2, and a corner P of the second semiconductor pattern 150b. As a result, the electric field may be prevented from being concentrated at the certain portion of the gate insulating layer 120, therefore preventing the gate insulating layer 120 from being burnt.

On the contrary, although not shown in figures, if the second semiconductor pattern 150b has a size larger than that of the storage electrode 160 in a plan view, the electric field flows from the second semiconductor pattern 150b to nearby corners of the storage electrode 160. In this configuration, corners of the storage electrode 160 can thus accumulate the electric field, risking a burning of the gate insulating layer 120.

FIGS. 5A, 6A, 7A, and 8A are plan views showing an exemplary embodiment of a method of manufacturing of a liquid crystal display according to the present invention, and FIGS. 5B, 6B, 7B, and 8B are cross sectional views taken along lines I-I' of each of the FIGS. 5A, 6A, 7A, and 8A. In FIGS. 5A to 8B, the same reference numerals denote the same elements described before, and thus the detailed descriptions of the same elements will be omitted.

Figure 5A:
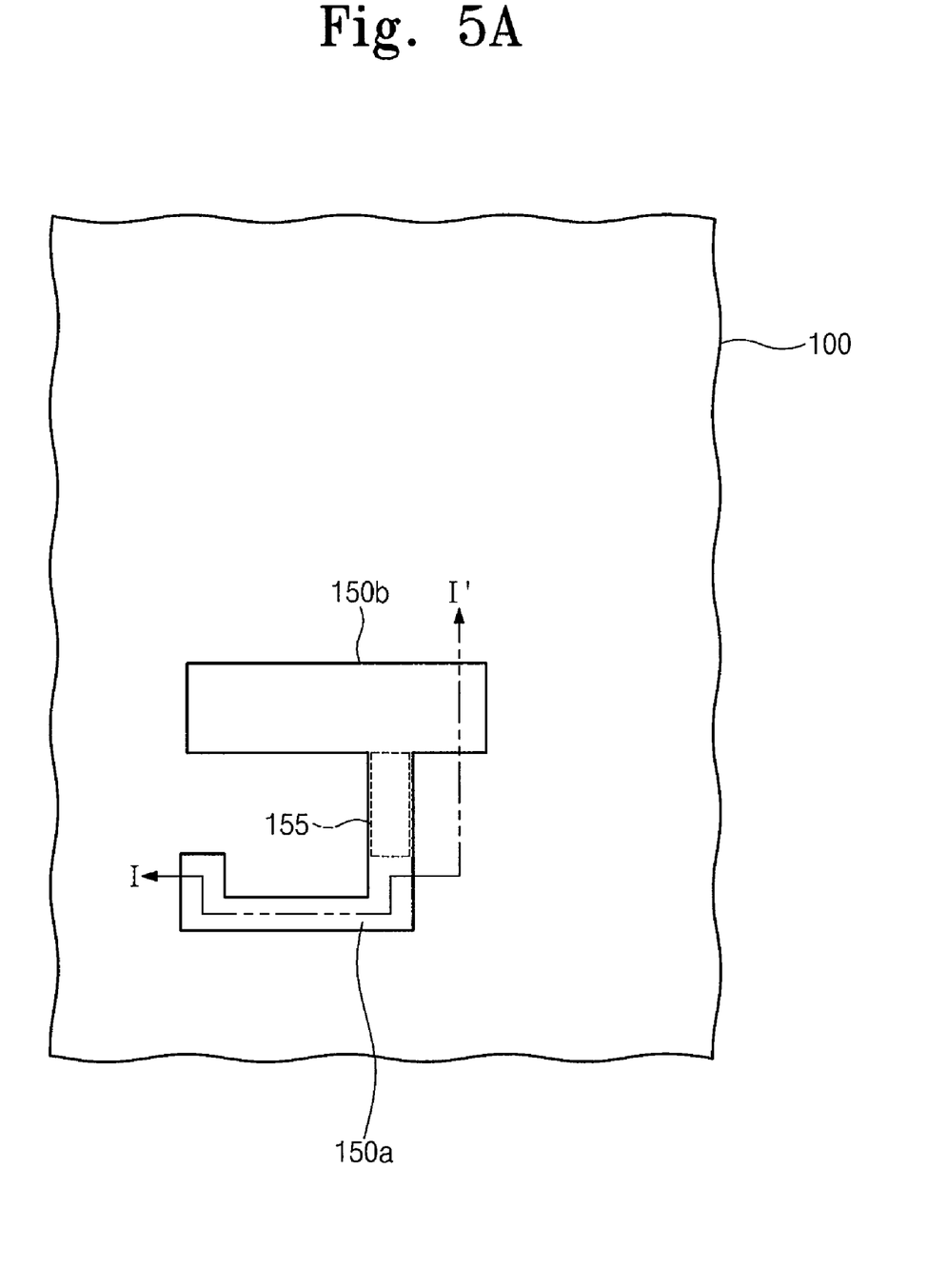
FIGS. 5A, 6A, 7A, and 8A are plan views showing an exemplary embodiment of a method of manufacturing of a liquid crystal display according to the present invention.
Figure 5B:
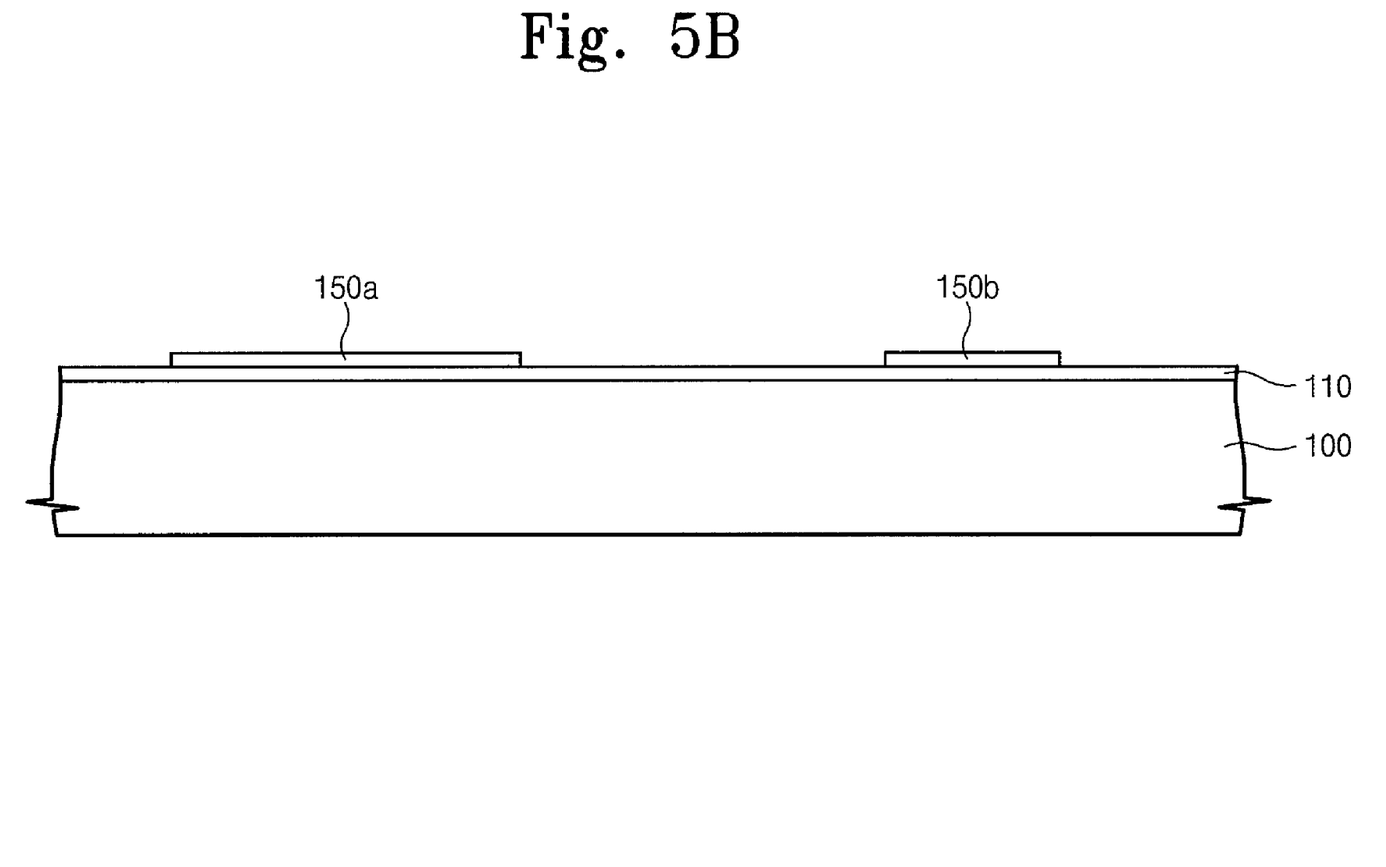
FIGS. 5B, 6B, 7B, and 8B are cross sectional views taken along line I-I' of FIGS. 5A, 6A, 7A, and 8A, respectively.

Referring to FIGS. 5A and 5B, a barrier layer 110 is formed on a first base substrate 100, and a first semiconductor pattern 150a and a second semiconductor pattern 150b, which are electrically connected to each other by a connector 155, are formed on the barrier layer 110.

Although not shown in FIGS. 5A and 5B, the connector 155, the first and second semiconductor patterns 150a and 150b may be formed through processes such as forming an amorphous silicon layer (not shown) on the barrier layer 110, annealing the amorphous silicon layer to form a polysilicon layer (not shown), and patterning the polysilicon layer.

Figure 6A:
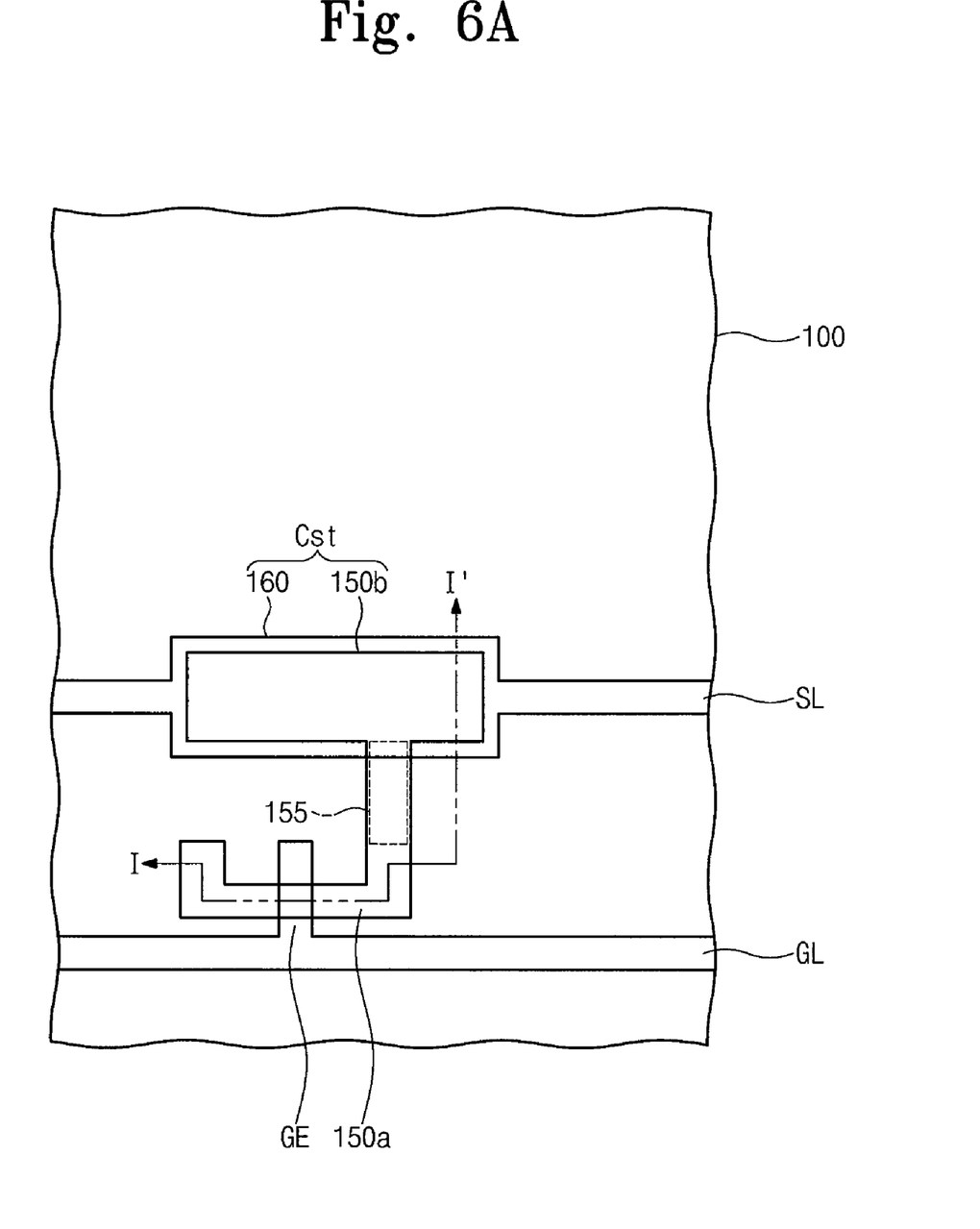
Figure 6B:
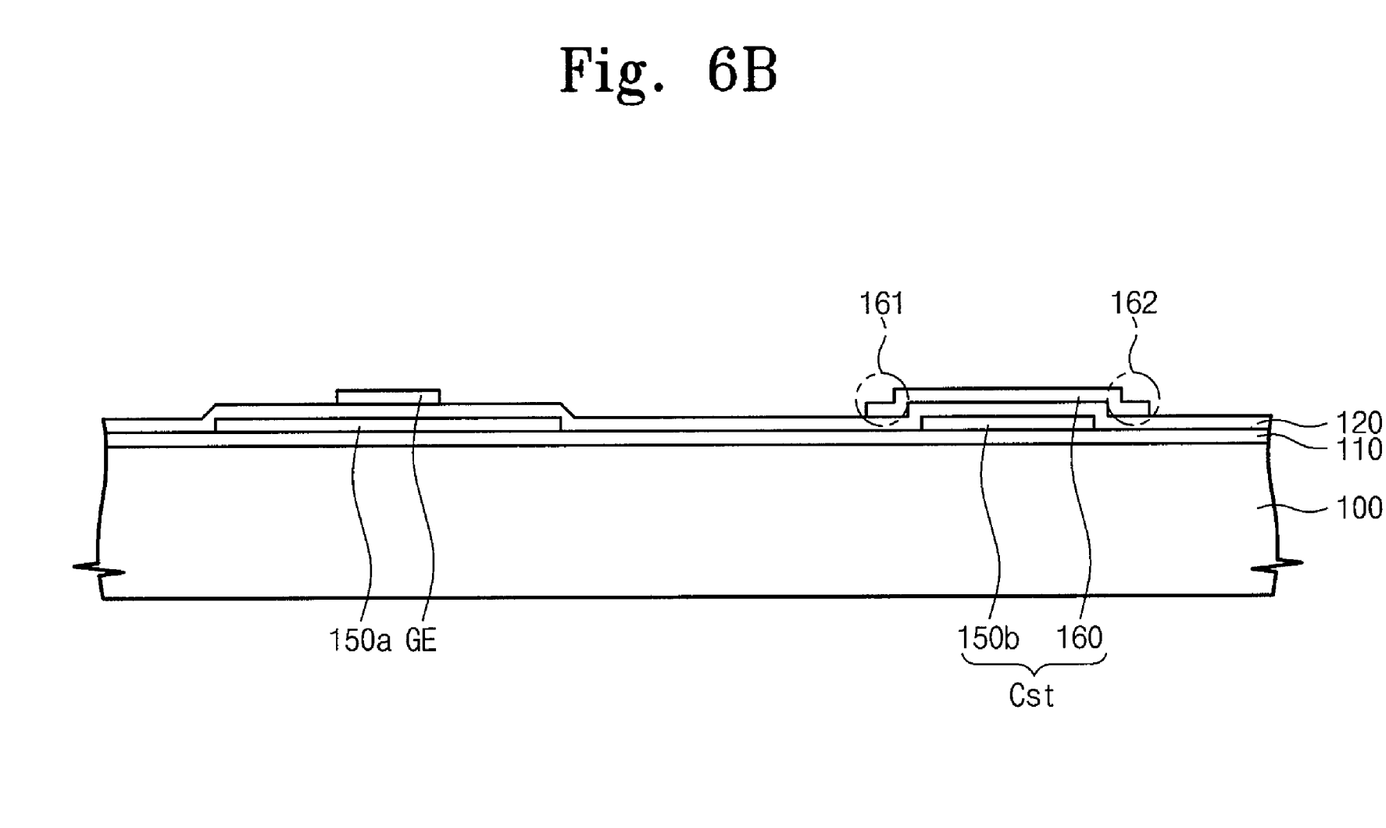

Referring to FIGS. 6A and 6B, after the connector 155, the first semiconductor pattern 150a and the second semiconductor pattern 150b are formed, a gate insulating layer 120 is formed to cover the first and second semiconductor patterns 150a and 150b. Also, after the gate insulating layer 120 is formed, a gate line GL, a gate electrode GE, a storage line SL, and a storage electrode 160 are formed on the first base substrate 100.

More particularly, a conductive layer (not shown) is formed on the first base substrate 100 to cover the first and second semiconductor patterns 150a and 150b, and the conductive layer is patterned, so that the gate line GL, the gate electrode GE, the storage line SL, and the storage electrode 160 are formed. The gate line GL is spaced apart from the storage line SL, and the gate electrode GE and the storage electrode GE are extended from the gate line GL and the storage line SL, respectively.

The gate electrode GE is formed so as to partially overlap the first semiconductor pattern 150a. In this manner, a thin film transistor having the gate electrode GE and the first semiconductor pattern 150a may have a top-gate structure.

Also, the storage electrode 160 overlaps the second semiconductor pattern 150b, thereby forming a storage capacitor Cst that has the storage electrode 160 and the second semiconductor pattern 150b as electrodes. The storage electrode 160 is formed larger than the second semiconductor pattern 150b, and thus the storage electrode 160 may cover an entire surface of the second semiconductor pattern 150b.

Static electricity can be generated when the first base substrate 100 makes contact with an external object (e.g., rollers that move the first base substrate 100). An electric field caused by this static electricity may be discharged to the storage electrode 160 through the first and second semiconductor patterns 150a and 150b. If the electric field is discharged to the storage electrode 160, the electric field flows through the second semiconductor pattern 150b, the gate insulating layer 120, and the storage electrode 160 sequentially.

If the second semiconductor pattern 150b has a size larger than that of the storage electrode 160 in a plan view, since the electric field may be concentrated at a corner of the storage electrode 160, the gate insulating layer 120 may be burnt by the electric field. However, in the present exemplary embodiment, the storage electrode 160 has a size larger than that of the second semiconductor pattern 150b in a plan view, so that the electric field that is generated in the second semiconductor pattern 150b disperses to end portions 161 and 162 of the storage electrode 160, thereby preventing the gate insulating layer 120 from being burnt by the concentrated the electric field.

Figure 7A:
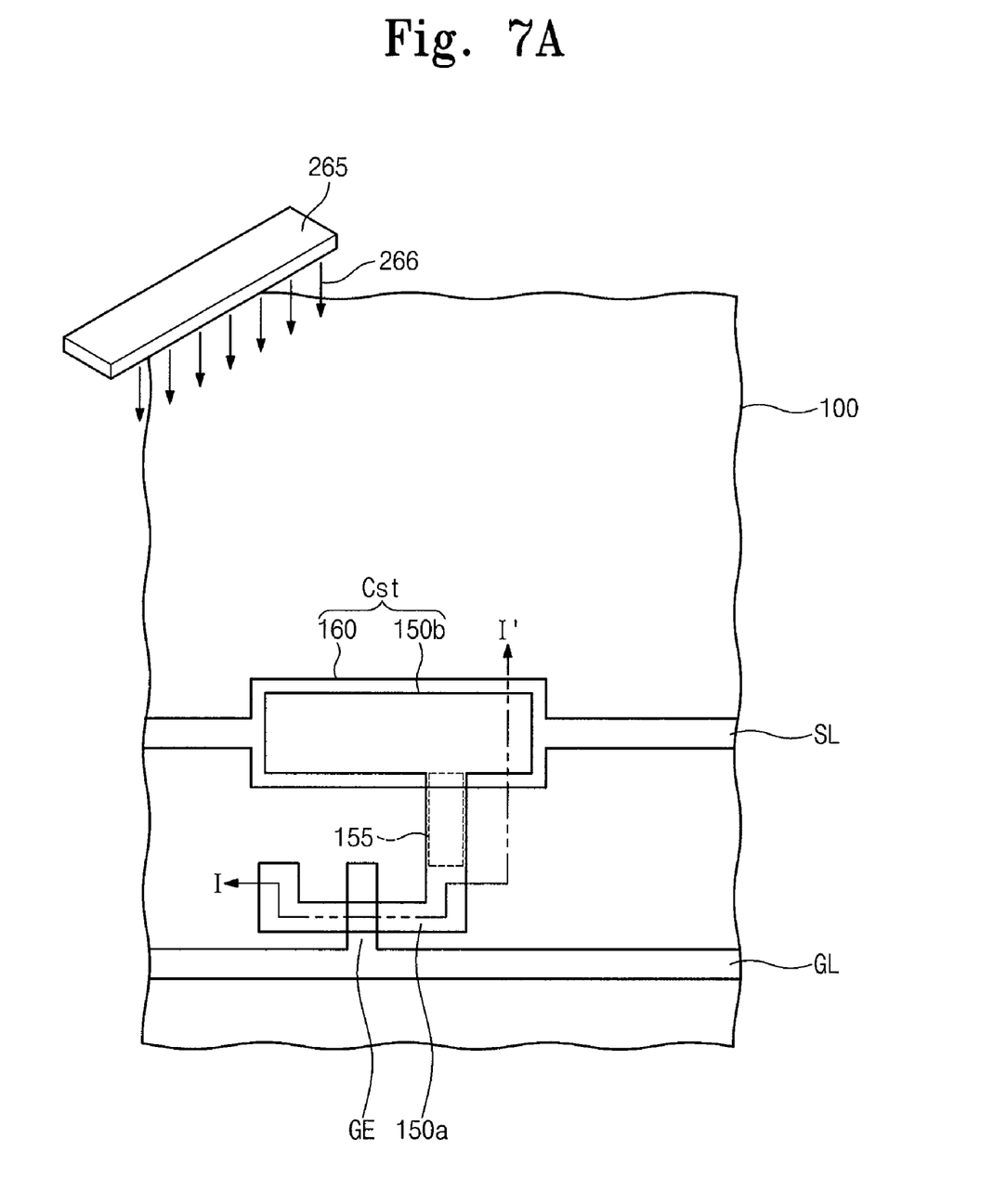
Figure 7B:
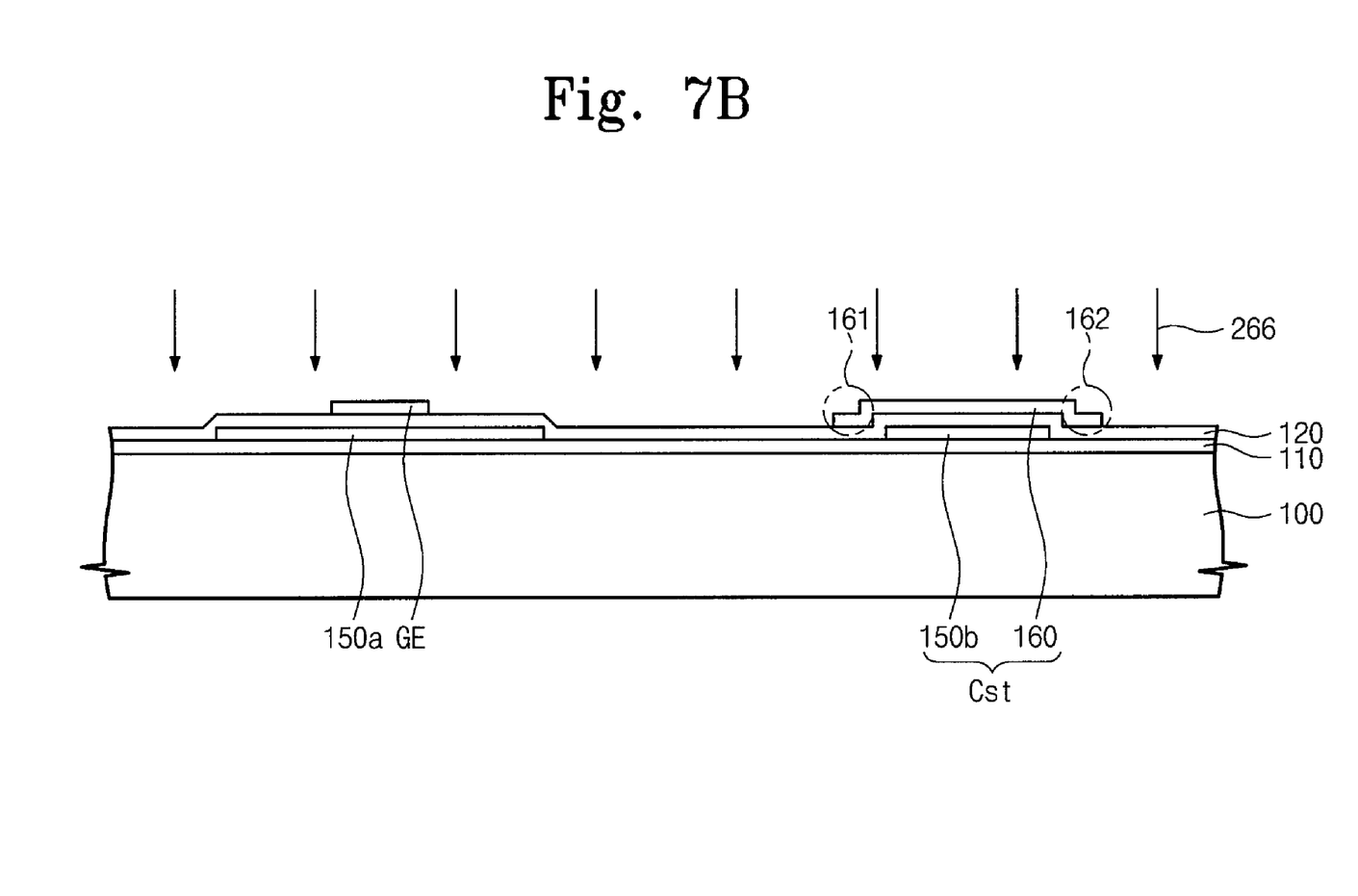

Referring to FIGS. 7A and 7B, an ion injection process uses an ion injection device 265 to apply ions 266 to the first semiconductor pattern 150a. Although not shown in detail in figures, the ion injection process may be performed two times in order to form a channel area, a source-drain area, and lightly doped drain (LDD) in the first semiconductor pattern 150a.

The ions 266 have electrical polarities that generate an electric field, causing movement of any static electricity that has accumulated in the first base substrate 100 or in thin layers arranged on the first base substrate 100. In case that the electric field is discharged through the storage electrode 160, the static electricity generated in the second semiconductor pattern 150 disperses to the storage electrode 160 since the storage electrode 160 has the size larger than that of the second semiconductor pattern 150b. Therefore, the gate insulating layer 120 is kept from being burnt by any concentrated the electric field.

Figure 8A:
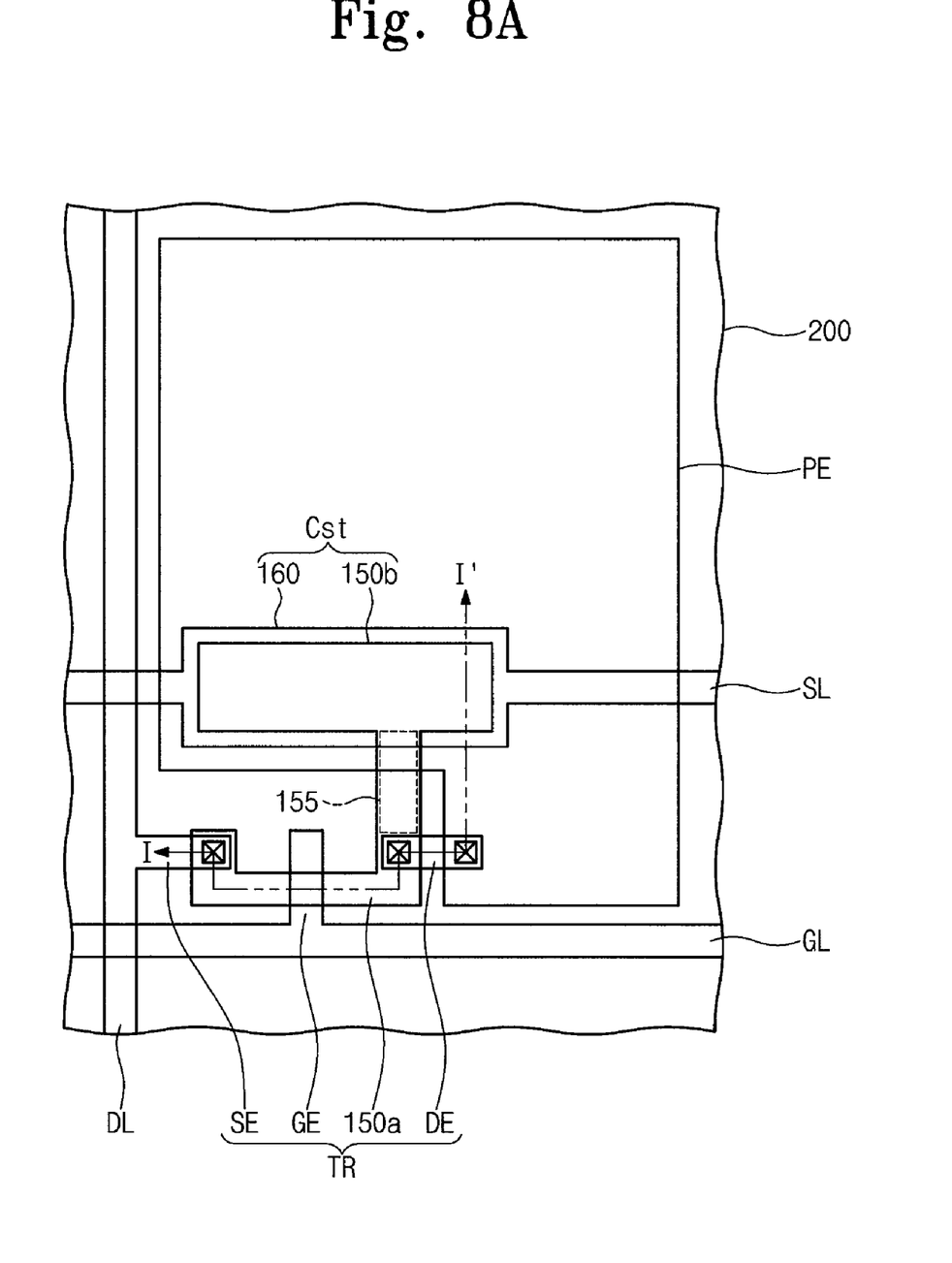
Figure 8B:
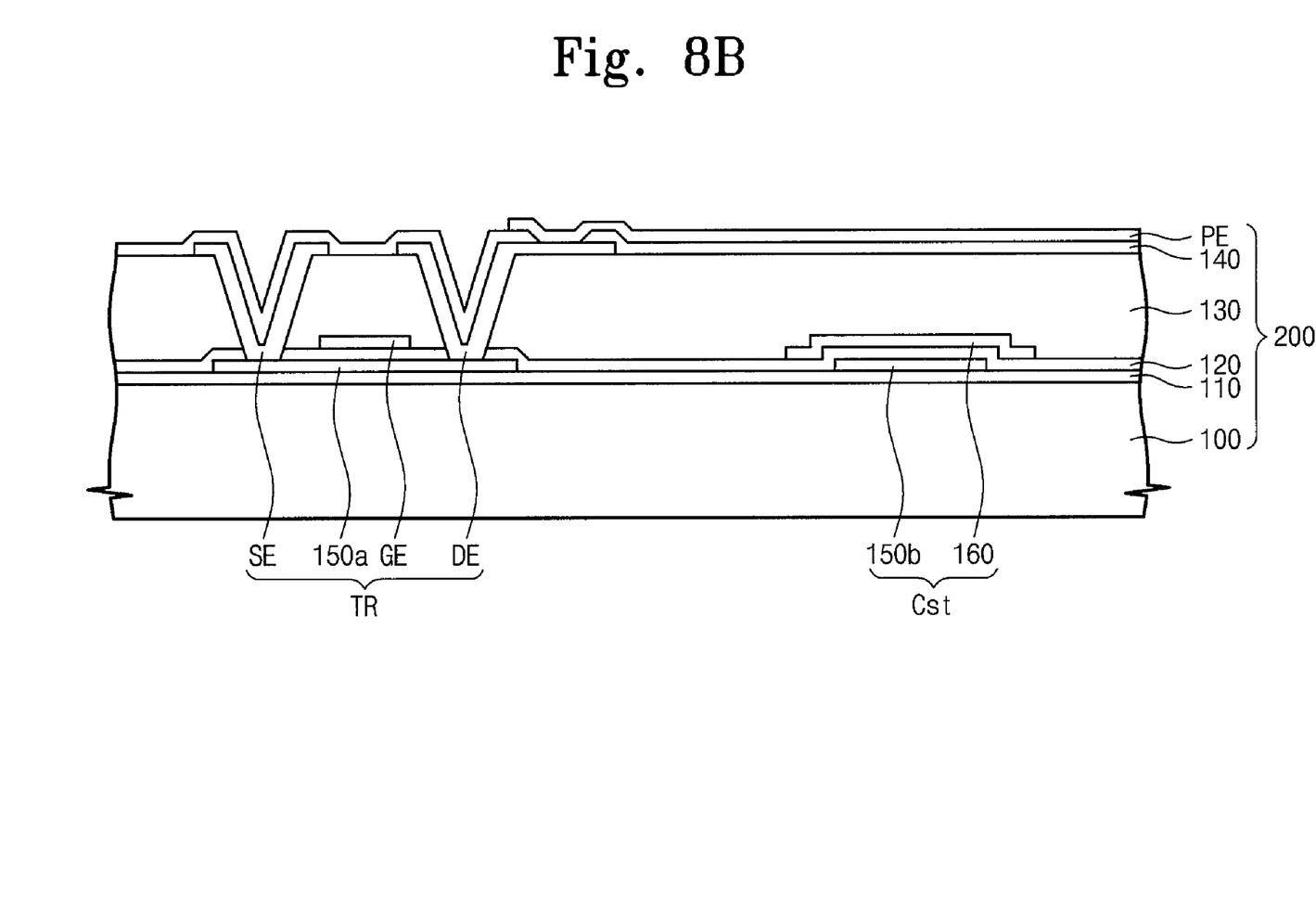

Referring to FIGS. 8A and 8B, an organic insulating layer 130 is formed to cover a thin film transistor TR and a storage capacitor Cst. The organic insulating layer 130 is partially removed to partially expose the first semiconductor pattern 150a.

After the organic insulating layer 130 is formed, a data line DL, a source electrode SE, and a drain electrode DE are formed to completely form the thin film transistor TR. The source electrode SE and the drain electrode DE are both formed above the first semiconductor pattern 150a, and are both electrically connected to the first semiconductor pattern 150a.

Also, an inter-insulating layer 140 is formed to cover the thin film transistor TR, and a pixel electrode PE that is electrically connected to the drain electrode DE is formed on the inter-insulating layer 140.

Referring to FIGS. 2 and 3 again, after the array substrate 200 is complete, liquid crystal 250 is provided to the array substrate 200, and a color filter substrate 400 is coupled with the array substrate 200, so as to complete the manufacture of an LCD 500.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A display apparatus comprising:
   a first substrate;
   a thin film transistor arranged on the first substrate and having a first semiconductor pattern that defines an active area and serves as a lower layer;
   a second semiconductor pattern connected to the first semiconductor pattern;
   a connector disposed between the first semiconductor and the second semiconductor pattern;
   a storage electrode arranged on the second semiconductor pattern and covering an entire surface of the second semiconductor pattern in a plan view;
   a pixel electrode electrically connected to the thin film transistor and
   a second substrate facing the first substrate,
   wherein the thin film transistor further comprises:
      a gate electrode arranged on the first semiconductor pattern; and
      a drain electrode spaced apart from the source electrode and electrically connected to the first semiconductor pattern and the pixel electrode,
   wherein the storage electrode serves as an upper storage electrode of a storage capacitor and the second semiconductor pattern serves as a lower storage electrode of the storage capacitor, and
   wherein the storage electrode comprises a material that is substantially the same as a material of the gate electrode.

2. The display apparatus of claim 1, wherein the storage electrode has a size larger than a size of the second semiconductor pattern in a plan view.

3. The display apparatus of claim 2, wherein the first semiconductor pattern and the second semiconductor pattern comprise a polysilicon.

4. The display apparatus of claim 1, further comprising:
   a gate line arranged on the first substrate;
   a data line arranged on the first substrate and substantially perpendicular to the gate line, so as to define a pixel area; and
   an insulating layer arranged between the storage electrode and the second semiconductor pattern.

5. The display apparatus of claim 1, wherein the storage electrode comprises an overlapping portion overlapping the second semiconductor pattern and an extension portion extended from the overlapping portion.

6. The display apparatus of claim 5, wherein a distance between an edge of the overlapping portion and an edge of the extension portion adjacent to the edge of the overlapping portion in a plan view is from about 0.5 micrometer to about 1.5 micrometer.

7. A display apparatus comprising:
   a first substrate;

a thin film transistor arranged on the first substrate and having a semiconductor pattern that defines an active area and serves as a lower layer;

a pixel electrode electrically connected to the thin film transistor;

a first storage electrode comprising a same material as that of the semiconductor pattern;

a second storage electrode arranged on the first storage electrode to cover an entire surface of the first storage electrode in a plan view;

an insulating layer disposed between the first storage electrode and the second storage electrode;

a second substrate facing the first substrate, wherein the thin film transistor further comprises:
   a gate electrode arranged on the semiconductor pattern;
   a source electrode electrically connected to the semiconductor pattern; and
   a drain electrode spaced apart from the source electrode and electrically connected to the semiconductor pattern, wherein the second storage electrode serves as an upper storage electrode of a storage capacitor and the first storage electrode serves as a lower storage electrode of the storage capacitor, and wherein the second storage electrode comprises a material that is substantially the same as a material of the gate electrode.

8. The display apparatus of claim 7, wherein the second storage electrode has a size larger than a size of the first storage electrode in a plan view.

9. The display apparatus of claim 8, wherein the semiconductor pattern and the first storage electrode comprise a polysilicon.

10. The display apparatus of claim 7, further comprising:
   a gate line arranged on the first substrate; and
   a data line arranged on the first substrate and substantially perpendicular to the gate line to define a pixel area.

11. The display apparatus of claim 7, wherein the second storage electrode comprises an overlapping portion overlapping the first storage electrode and an extension portion extending from the overlapping portion.

12. The display apparatus of claim 11, wherein a distance between an edge of the overlapping portion and an edge of the extension portion adjacent to the edge of the overlapping portion in a plan view is from about 0.5 micrometer to about 1.5 micrometer.

* * * * *